United States Patent
Yang

(10) Patent No.: US 9,420,712 B2
(45) Date of Patent: Aug. 16, 2016

(54) PORTABLE CLAMPING APPARATUS FOR MOBILE EQUIPMENT

(71) Applicant: REAPER PHOTO SUPPLY LIMITED, Hong Kong (CN)

(72) Inventor: Yongjian Yang, Hong Kong (CN)

(73) Assignees: REAPER PHOTO SUPPLY LIMITED (CN); Yongjian Yang (CN)

( * ) Notice: Subject to any disclaimer, the term of this patent is extended or adjusted under 35 U.S.C. 154(b) by 0 days.

(21) Appl. No.: 14/733,142

(22) Filed: Jun. 8, 2015

(65) Prior Publication Data
US 2015/0359114 A1    Dec. 10, 2015

(30) Foreign Application Priority Data

Jun. 6, 2014 (CN) .......................... 2014 1 0251049

(51) Int. Cl.
| F16M 11/00 | (2006.01) |
|---|---|
| A47B 97/04 | (2006.01) |
| H05K 5/02 | (2006.01) |
| F16M 11/28 | (2006.01) |
| F16M 11/04 | (2006.01) |
| F16B 2/12 | (2006.01) |

(52) U.S. Cl.
CPC ................ *H05K 5/0204* (2013.01); *F16B 2/12* (2013.01); *F16M 11/04* (2013.01); *F16M 11/28* (2013.01)

(58) Field of Classification Search
CPC ........ H05K 5/0204; F16B 2/12; F16M 11/04; F16M 11/28; A47B 97/04; A47B 97/08
USPC .............. 248/161, 441.1, 448, 449, 451, 452, 248/453, 460
See application file for complete search history.

(56) References Cited

U.S. PATENT DOCUMENTS

| 3,738,606 | A | * | 6/1973 | Millen | ................... | A47B 97/08 |
|---|---|---|---|---|---|---|
| | | | | | | 108/15 |
| 4,165,856 | A | * | 8/1979 | Wiseheart | .............. | A47B 97/04 |
| | | | | | | 248/161 |
| 5,110,076 | A | * | 5/1992 | Snyder | ............... | A61M 5/1415 |
| | | | | | | 248/125.3 |
| 5,769,369 | A | * | 6/1998 | Meinel | .................. | B60N 3/001 |
| | | | | | | 108/45 |
| 5,791,623 | A | * | 8/1998 | Louridas | ................ | A47B 97/08 |
| | | | | | | 248/168 |

(Continued)

FOREIGN PATENT DOCUMENTS

| CN | 202992583 U | 6/2013 |
|---|---|---|
| CN | 203421457 U | 2/2014 |
| CN | 103685644 A | 3/2014 |

*Primary Examiner* — Anita M King
(74) *Attorney, Agent, or Firm* — Schmeiser, Olsen & Watts, LLP

(57) ABSTRACT

A portable clamping apparatus for mobile equipment, which comprises a clamping assembly, a holding assembly and a tube-pole assembly used to connect other assembly, the holding assembly is configured on the bottom of the tube-pole assembly to secure others assembly, wherein the clamping assembly comprises a main body configured with a lower fixing end on its lower position, and a moveable mechanism configured on the main body, comprising several connecting rods and elastic parts used to reset the connecting rods; an upper end of the connecting rods is provided with an upper fixing end corresponding to the lower fixing end; the tube-pole assembly is connected to the clamping assembly by means of a platform assembly comprising a platform base, connecting brackets hinged to the platform base and an adjusting mechanism used to establish connection with clamping assembly and adjust the connecting rods to slide upwardly or downwardly is provided.

10 Claims, 7 Drawing Sheets

(56) References Cited

U.S. PATENT DOCUMENTS

| | | | |
|---|---|---|---|
| 5,944,896 A * | 8/1999 | Landesman | B05B 13/0285 118/500 |
| 6,748,873 B2 * | 6/2004 | Brown, Sr. | A47B 3/10 108/49 |
| 7,543,790 B2 * | 6/2009 | Starcher | A47B 97/08 248/163.1 |
| 8,066,241 B2 * | 11/2011 | Yu | F16M 11/04 248/286.1 |
| 8,235,334 B1 * | 8/2012 | Kobal | F16M 11/041 248/122.1 |
| 8,469,325 B2 * | 6/2013 | Yu | G10G 5/005 248/231.51 |
| 2007/0040089 A1 * | 2/2007 | Shiff | A47B 97/04 248/448 |

\* cited by examiner

PORTABLE CLAMPING APPARATUS FOR MOBILE EQUIPMENT

CROSS REFERENCE TO RELATED APPLICATION

This application claims priority to Chinese Application No. CN 201410251049.4 having a filing date of Jun. 6, 2014, the entire contents of which are hereby incorporated by reference.

FIELD OF TECHNOLOGY

The following refers to the field of clamping tools, particularly to portable clamping apparatus for mobile equipment.

BACKGROUND

The mobile equipment, may be various electronic equipment, such as a cell phone, a tablet, a portable navigation and so on, which can be used for selfie, photography, video-camera, online reading, recording, GPS (Global Positioning System) navigation etc.

For example, a smartphone can be used both for calling and for selfie, photography, a video-camera, online reading, recording, GPS navigation, etc. However, when a user takes a selfie using a smartphone/tablet by himself, the photo may be imperfect due to short distance between the user and the smartphone/tablet. Meanwhile holding of the smartphone/tablet for a longtime in order to read/watch the screen may cause one's arms to become tired.

Chinese invention patent application 201410009154.7 discloses a portable clamping apparatus, in which the clamping elements are adjusted only slightly, and the angle between the clamping elements cannot be adjusted, thus the clamping apparatus cannot apply to various mobile equipment, meanwhile, its stability of the supporting mechanism will also be improved.

SUMMARY

An aspect relates to a foldable, portable clamping apparatus for mobile equipment with a steady holder, to solve the technical problems above.

This aspect is achieved by the following technical solution:

A portable clamping apparatus for mobile equipment comprises a clamping assembly, a holding assembly and a tube-pole assembly used to connect the clamping assembly and the holding assembly, the holding assembly is configured on the bottom of the tube-pole assembly to secure the tube-pole assembly and the clamping assembly, wherein the clamping assembly comprises a main body configured with a lower fixing end on its lower position, and a moveable mechanism configured on the main body, comprising a number of connecting rods and elastic parts used to reset the connecting rods; an upper end of the connecting rods is provided with an upper fixing end corresponding to the lower fixing end.

The tube-pole assembly is connected to the clamping assembly by means of a platform assembly comprising a platform base, connecting brackets hinged to the platform base and an adjusting mechanism used to establish connection with clamping assembly and adjust the connecting rods to slide upwardly or downwardly.

Further, the connecting rods comprise upper connecting rods provided with lock-mechanism on both ends, and lower connecting rods provided with lock-mechanism on the lower ends of the lower connecting rods; the upper connecting rods are sheathed into the lower connecting rods.

The elastic parts comprise upper elastic elements configured in the lower connecting rod and connected to the lock-mechanism of the lower end of upper connecting rods, and lower elastic elements configured in the main body and connected to the lock-mechanism of the lower end of the lower connecting rod; the lock-mechanism on the upper end of the upper connecting rod is configured in the upper fixing end.

Further, the upper fixing end is hinged to the upper connecting rods and the lower fixing end is hinged to the lower end of the main body.

The upper fixing end comprises the upper bracket connecting to the upper connecting rods and the upper clamping plate hinged to the upper bracket through bolts; the lower fixing end comprises the lower clamping plate hinged to the lower end of the main body. Both of the fixing ends may be folded around the hinge shaft and make the apparatus convenient to carry.

Further, the adjusting mechanism comprises a wheel provided on the connecting brackets, a connecting screw permanently coupled with the wheel, and a locking lid used to fasten the wheel and the connecting screw; and the locking lid is provided with a through hole through which the connecting screw extends outwardly.

There are two connecting rods provided in the main body, and a mounting hole is also provided on the main body for fixing up the connecting screw, the mounting hole is positioned on the middle of interval between the two lower connecting rods and is provided a thread inside to correspond to the thread of the connecting screw.

Further, the tube-pole assembly comprises several tube-poles wherein one can be sheathed in an adjacent one, the upper end of each of the tube-poles is provided with a fixing slot configured with a locating ring where an elastic ring is disposed; the lower end of each of the tube-poles is provided with a blocking slot used for holding the blocking slip; the tube-pole can be sheathed in an adjacent one, in which manner the height of the clamping assembly can be adjusted by stretching and shrinking to increase portability of the apparatus.

Further, the locating ring is encircled by a sleeve.

Further, the holding assembly comprises a pedestal, a plurality of holding brackets configured on the pedestal, and positioning mechanism used for limiting the position of the holding brackets.

Further, mounting slots used for fixing up the holding brackets are provided on the pedestal, and the holding brackets are hinged to the mounting slots; the positioning mechanism is a turntable provided with grooves corresponding to holding brackets, the turntable is configured on the pedestal freely. When the grooves do correspond to the position of the holding brackets, the holding brackets can be folded. When the grooves do not correspond to the position of the holding brackets anymore, the turntable presses against the holding brackets such that the holding brackets are placed radially and provide a steady support to the holding assembly and the clamping assembly.

Further, a rubber pad is provided on the surface of locking lid where it contacts the clamping assembly.

Further, both the upper clamping plate in the upper fixing end and the lower clamping plate in the lower fixing end are provided with elastic pads used for clamping the mobile equipment. The main body is provided with threads matching with the connecting screw. The elastic pads may act a buffer to prevent damage to the mobile equipment.

Compared with the prior art, the advantages of embodiments of the present invention are as follows:

Embodiments of the present invention can adjust the space between the two fixing ends by sliding the upper connecting rods upwardly and downwardly in order to clamp a variety of mobile equipment. When the mobile equipment is clamped, the upper and lower elastic elements reset the upper and lower connecting rods respectively, whereby the elastic elements stay in stretched state to make sure the mobile equipment is clamped steadily between the upper and lower fixing ends. The clamping assembly and the platform assembly can rotate around the hinge shaft, thereby the angle of the mobile equipment clamped can be optimized for better experience. Moreover, the apparatus can be foldable, reducing its size, and increasing its portability.

BRIEF DESCRIPTION

A preferable embodiment of the present invention will be described in detail hereinafter with reference to accompanying drawings, wherein.

LIST OF REFERENCE CHARACTERS

100—clamping assembly
110—moveable mechanism
111—upper clamping plate
112—elastic cushion
113—upper bracket
114—upper connecting rod
115—lower connecting rod
116—upper elastic element
117—lower elastic element
120—main body portion
121—lower clamping plate
122—lower elastic cushion
123—main body
124—main body cover
125—mounting hole
200—platform assembly
210—left connecting bracket
211—hinge shaft
220—right connecting bracket
230—locking lid
240—connecting screw
250—wheel
260—platform base
270—rubber pad
300—tube-pole assembly
310—supporting tube
320—locating ring
330—elastic ring
340—blocking slip
350—sleeve
400—holding assembly
410—turntable
420—pedestal
431—notch

DETAILED DESCRIPTION

Embodiments of the present invention will be further described hereinafter with reference to the exemplary embodiment. It should be understood that the exemplary embodiment described hereafter is used to illustrate and explain embodiments of the present invention, and not constitute any limitation to embodiments of the present invention.

As shown in FIGS. 1-7, a portable clamping apparatus for mobile equipment according to embodiments of the present invention comprises a clamping assembly 100, a tube-pole assembly 300 and a holding assembly 400 set up on the bottom of the tube-pole assembly 300, wherein the tube-pole assembly 300 connects to the clamping assembly 100 by means of a platform assembly 200.

Figure 1:
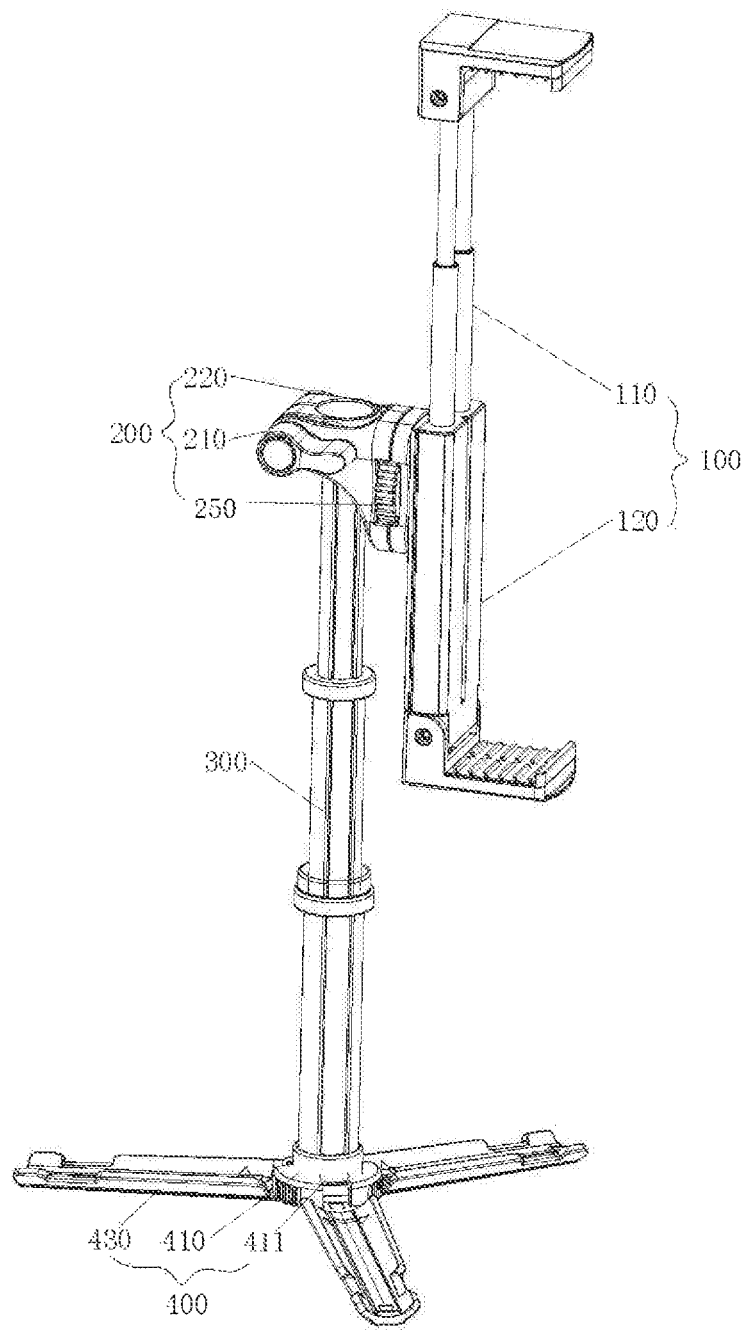
FIG. 1 is a structural view of the portable clamping apparatus for mobile equipment.
Figure 2:
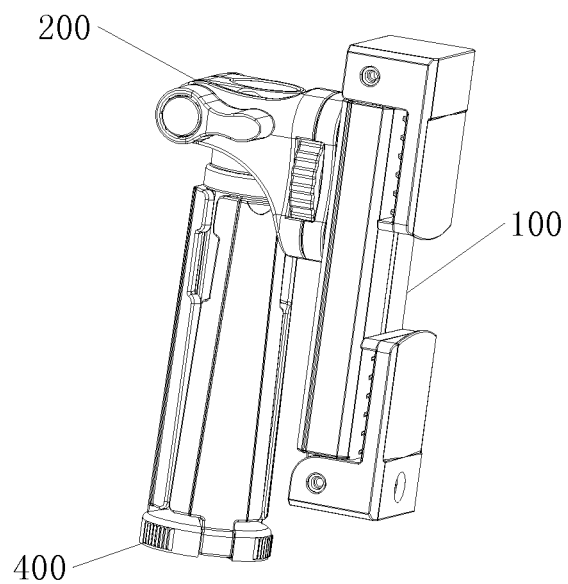
FIG. 2 is a schematic view of the portable clamping apparatus for mobile equipment, in folded status.
Figure 3:
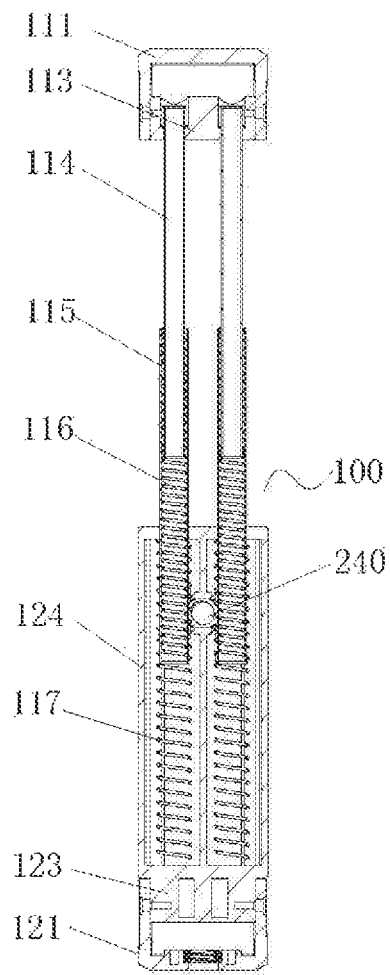
FIG. 3 is a cross section view of the clamping assembly of the portable clamping apparatus for mobile equipment.
Figure 4:
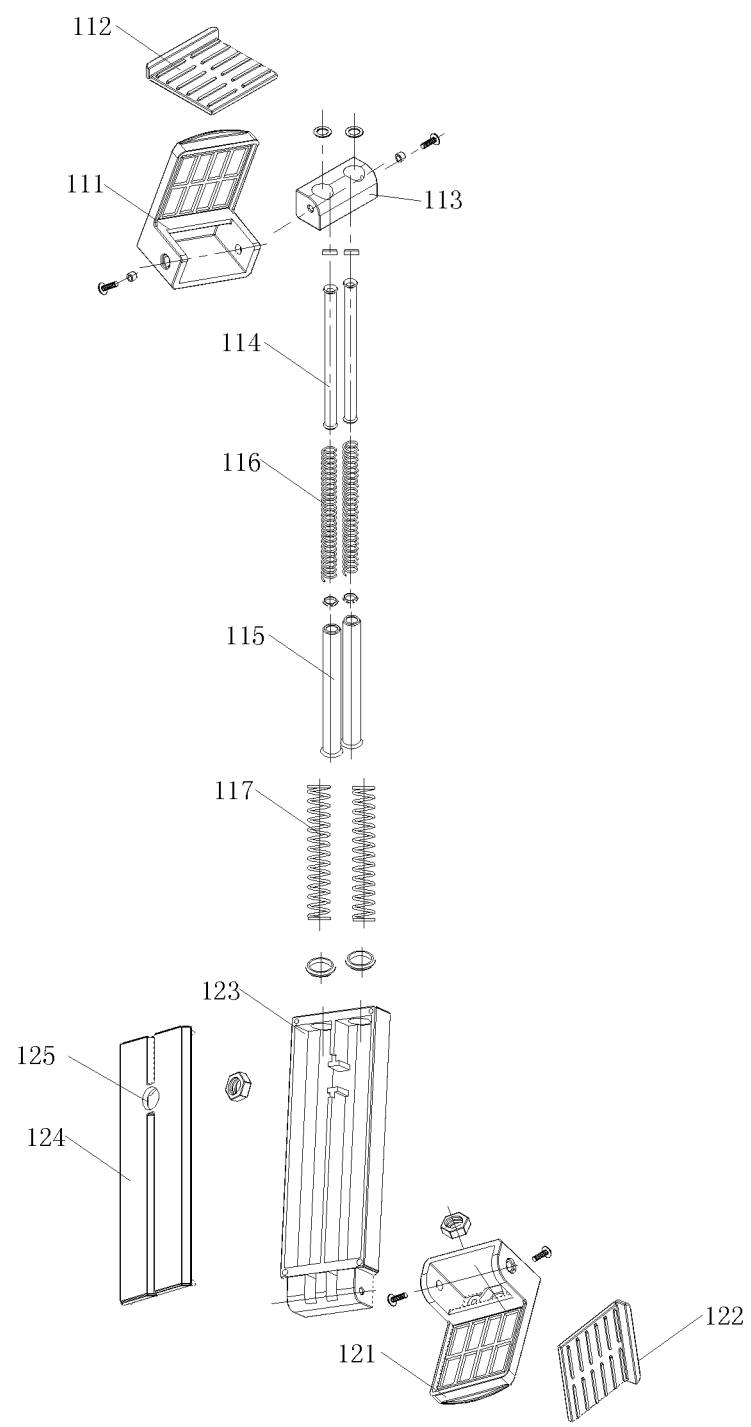
FIG. 4 is an explosive view of the clamping assembly of the portable clamping apparatus for mobile equipment.

As shown in FIGS. 1, and 3-4, the clamping assembly 100 comprises a main body portion 120 and a moveable mechanism 110 provided thereon, wherein the main body portion 120 comprises the main body 123, a lower fixing end hinged to the lower end of the main body 123, and main body cover 124, wherein the lower fixing end comprises a lower clamping plate 121 hinged to the lower end of the main body 123 through bolts, and an elastic cushion 122 provided on the surface of the lower clamping plate 121 where it will contact the mobile equipment. The moveable mechanism 110 comprises lower connecting rods 115, upper connecting rods 114 and an upper fixing ends, wherein the lower connecting rods 115 are provided in the main body 123, the upper connecting rods 114 are sheathed into the lower connecting rods 115, and the upper fixing ends are provided on the top end of the upper connecting rods 114. Besides, the moveable assembly 110 also comprises elastic parts which consist of lower elastic elements 117 and upper elastic elements 116, wherein the lower elastic elements 117 are configured inside the main body 123, both ends of each of the lower elastic parts 117 are connected to the bottom of the main body 123 and to the lower end of the lower connecting rods 115 respectively; the upper elastic elements 116 are configured inside the lower connecting rods 115, both ends of each of the upper elastic elements115 are connected to the lower connecting rods 115 and to the lower end of the upper connecting rods 114 respectively. Particularly, the lower elastic elements 117 and the upper elastic elements 116 are springs. Both ends of each upper connecting rod 114 are provided with a lock-mechanism, so does the lower end of each lower connecting rod 115, via which the lower connecting rods 115 connect to the lower elastic parts 117.

The upper fixing end comprises the upper bracket 113 connecting with the upper connecting rods 114, and the upper clamping plate 111 hinged to the upper bracket 113 through bolts. The upper ends of the upper connecting rods 114 are locked into the upper bracket 113 and an elastic cushion 112 is provided on the surface of the upper clamping plate 111 where the mobile equipment will contact with. Preferably, the elastic cushion 112 made of soft materials such as rubber, silica gel, sponge and foam etc.

Preferably there is a pair of upper connecting rods 114, a pair of lower connecting rods 115 and a pair of elastic elements, each pair is configured in parallel. A mounting hole 125 is provided on the main body cover 124 and positioned on the middle of interval between the two lower connecting rods 115.

Figure 5:
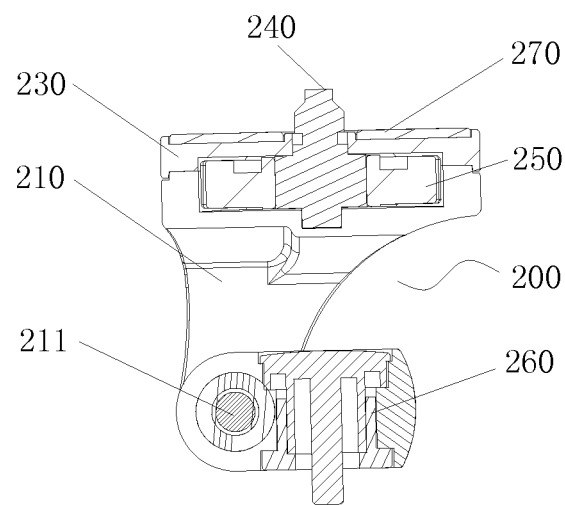
FIG. 5 is a cross section view of the platform assembly of the portable clamping apparatus for mobile equipment.

As shown in FIG. 5, the platform assembly 200 comprises a platform base 260, a left connecting bracket 210 and a right connecting bracket 220 both hinged to the platform base 260 through a hinge shaft 211, and an adjusting mechanism used to establish the connection with clamping assembly 100 and adjust the moveable mechanism to slide upwardly or downwardly. The adjusting mechanism comprises a wheel 250 provided on the left connecting bracket 210 and right connecting bracket 220, a connecting screw 240 permanently connected with the wheel 250 and a locking lid 230 used to fasten the wheel 250 and connecting screw 240, wherein the locking lid 230 is provided with a through hole through which the connecting screw 240 extends outwardly. The connecting screw 240 can be through the mounting hole 125 on the main body cover 124, to be fixed by a nut. A rubber pad 270 is provided on the surface of locking lid 230 where the clamping assembly contacts with. The main body 120 is provided with threads matching with the connecting screw 240.

Figure 6:
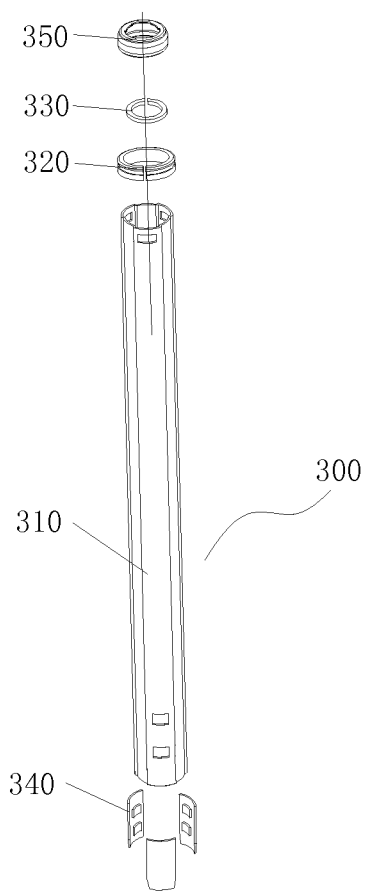
FIG. 6 is an explosive view of the supporting tube assembly of the portable clamping apparatus for mobile equipment.

As shown in FIG. 6, the tube-pole assembly 300 comprises several tube-poles 310 wherein one can be sheathed in an adjacent one. The upper end of each of the tube-poles 310 is provided with a through fixing slot, wherein a locating ring 320 is provided in the fixing slot, and a groove and an elastic ring 330 on it is provided in the locating ring 320 to increase its elasticity inwardly. The lower end of each of the tube-poles 310 is provided with a blocking slot used for holding the blocking slip 340. When one of the tube-poles 310 is pulled from another, the blocking slip 340 is positioned by the locating ring 320, and provides the support required. Further, the locating ring 320 is encircled by a sleeve 350 used for orientating the tube-poles 310 and limiting the outward movement of the locating ring 320.

Figure 7:
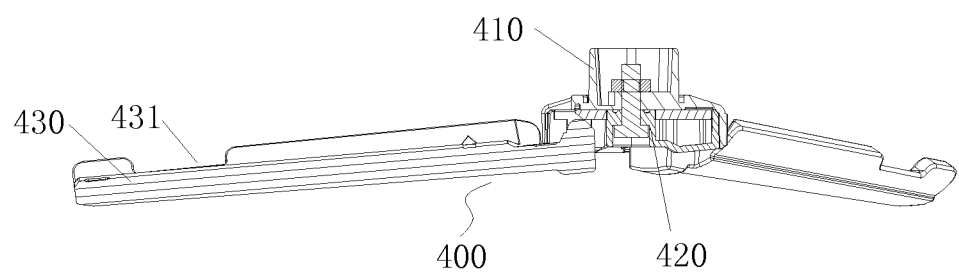
FIG. 7 is a cross section view of the supporting assembly of the portable clamping apparatus for mobile equipment.

As shown in FIG. 7, the holding assembly 400 comprises the pedestal 420, a plurality of brackets 420 hinged to the pedestal 420 and a turntable 410 provided on the pedestal 420. The mounting slots used for fixing up the holding brackets 430 are provided on the pedestal 420 uniformly, and the turntable 420 is provided with the grooves 411 corresponding to holding brackets 430. The length of each holding bracket 430 is equal to the length of each of the tube-poles 310 while the top surface of the holding bracket 430 matches with the external surface of the tube-pole 310, wherein two notches 431 are provided on the both sides of each holding bracket 430 for fingers.

When the turntable 420 rotates, the grooves 411 do not correspond to the position of the holding brackets 430 anymore, the turntable 420 presses against the holding brackets 430 such that the holding brackets 430 are placed radially and provide a steady support to the holding assembly 400 and the clamping assembly 100. On the contrary, when the turntable rotates reversely, the grooves 411 do correspond to the position of the holding brackets 430, the holding brackets 430 can be folded upwardly to be vertical, to close to the tube-poles assembly 300. This folded status will save the space required, and facilitate portability of the apparatus.

The clamping apparatus according to embodiments of the present invention can be folded and make its smaller size, compact structure and better portability. Since the apparatus can adapt to different sizes of various mobile equipment due to its adjustability to the clamping height and angle, the user experience can be optimized thereby.

The embodiment described hereinbefore is merely a preferred embodiment of the present invention and not for purposes of any restrictions or limitations on embodiments of the invention. It will be apparent that any non-substantive, obvious alterations or improvement by the technician of this technical field according to embodiments of the present invention may be incorporated into ambit of claims of embodiments of the present invention.

What is claimed is:

1. A portable clamping apparatus for mobile equipment, comprising:
    a clamping assembly, a holding assembly and a tube-pole assembly used to connect the clamping assembly and the holding assembly, the holding assembly is configured on the bottom of the tube-pole assembly to secure the tube-pole assembly and the clamping assembly, wherein the clamping assembly comprises a main body configured with a lower fixing end on its lower position, and a moveable mechanism configured on the main body, comprising a number of connecting rods and elastic parts used to reset the connecting rods; an upper end of the connecting rods is provided with an upper fixing end corresponding to the lower fixing end;
    wherein the tube-pole assembly is connected to the clamping assembly by a platform assembly comprising a platform base, connecting brackets hinged to the platform base and an adjusting mechanism used to establish connection with clamping assembly and adjust the connecting rods to slide upwardly or downwardly.

2. The portable clamping apparatus of claim 1, wherein the connecting rods comprise upper connecting rods provided with a lock-mechanism on both ends, and lower connecting rods provided with a lock-mechanism on the lower ends of the lower connecting rods; the upper connecting rods are sheathed into the lower connecting rods;
    the elastic parts comprise upper elastic elements configured in the lower connecting rod and connected to the lock-mechanism of the lower end of upper connecting rods, and lower elastic elements configured in the main body and connected to the lock-mechanism of the lower end of the lower connecting rod; the lock-mechanism on the upper end of the upper connecting rod is configured in the upper fixing end.

3. The portable clamping apparatus of claim 2, wherein the upper fixing end is hinged to the upper connecting rods and the lower fixing end is hinged to the lower end of the main body;
    the upper fixing end comprises an upper bracket connecting to the upper connecting rods and an upper clamping plate hinged to the upper bracket through bolts; the lower fixing end comprises a lower clamping plate hinged to the lower end of the main body.

4. The portable clamping apparatus of claim 1, wherein the adjusting mechanism comprises a wheel provided on the connecting brackets, a connecting screw permanently coupled with the wheel, and a locking lid used to fasten the wheel and the connecting screw; and the locking lid is provided with a through hole through which the connecting screw extends outwardly;
    wherein two connecting rods are provided in the main body, and a mounting hole is also provided on the main body for fixing up the connecting screw, the mounting hole is positioned on the middle of interval between the two lower connecting rods and is provided a thread inside to correspond to the thread of the connecting screw.

5. The portable clamping apparatus of claim 1, wherein the tube-pole assembly comprises several tube-poles wherein one can be sheathed in an adjacent one, the upper end of each of the tube-poles is provided with a fixing slot configured with a locating ring where an elastic ring is disposed; the lower end of each of the tube-poles is provided with a blocking slot used for holding the blocking slip.

6. The portable clamping apparatus of claim 5, wherein the locating ring is encircled by a sleeve.

7. The portable clamping apparatus of claim 1, wherein the holding assembly comprises a pedestal, a plurality of holding brackets configured on the pedestal, and positioning mechanism used for limiting the position of the holding brackets.

8. The portable clamping apparatus of claim 7, wherein mounting slots used for fixing up the holding brackets are provided on the pedestal, and the holding brackets are hinged to the mounting slots; the positioning mechanism is a turntable provided with grooves corresponding to holding brackets, the turntable is configured on the pedestal freely.

9. The portable clamping apparatus of claim 4, wherein a rubber pad is provided on the surface of locking lid where it contacts the clamping assembly.

10. The portable clamping apparatus of claim 3, wherein both the upper clamping plate in the upper fixing end and the lower clamping plate in the lower fixing end are provided with elastic pads used for clamping the mobile equipment.

* * * * *